(12) United States Patent
Chen et al.

(10) Patent No.: US 9,557,354 B2
(45) Date of Patent: Jan. 31, 2017

(54) SWITCHED CAPACITOR COMPARATOR CIRCUIT

(75) Inventors: Chih-Chia Chen, Taipei (TW); Kuan-Yu Lin, Zhudong Township (TW); Chin-Chou Liu, Jhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 1081 days.

(21) Appl. No.: 13/362,576

(22) Filed: Jan. 31, 2012

(65) Prior Publication Data

US 2013/0193981 A1 Aug. 1, 2013

(51) Int. Cl.
*G01R 19/165* (2006.01)
*H03K 5/24* (2006.01)
*G01R 31/3185* (2006.01)
*G01R 31/28* (2006.01)

(52) U.S. Cl.
CPC .......... *G01R 19/16552* (2013.01); *H03K 5/24* (2013.01); *G01R 31/2856* (2013.01); *G01R 31/318513* (2013.01)

(58) Field of Classification Search
None
See application file for complete search history.

(56) References Cited

U.S. PATENT DOCUMENTS

| | | | | |
|---|---|---|---|---|
| 4,691,189 A | * | 9/1987 | Dingwall | H03M 1/165 327/77 |
| 5,952,951 A | * | 9/1999 | Fujino | H03K 5/249 326/84 |
| 2002/0133748 A1 | * | 9/2002 | Corr | G01R 19/16552 714/25 |
| 2002/0175715 A1 | * | 11/2002 | Nii | H03K 5/249 327/77 |
| 2005/0110526 A1 | * | 5/2005 | Ishibashi | G01R 31/025 327/18 |

OTHER PUBLICATIONS

Muhtaroglu, Ali, et al., "On-Die Droop Detector for Analog Sensing of Power Supply Noise", IEEE Journal of Solid—State Circuits, vol. 39, No. 4, Apr. 2004, pp. 651-660.

* cited by examiner

*Primary Examiner* — Melissa Koval
*Assistant Examiner* — Courtney McDonnough
(74) *Attorney, Agent, or Firm* — Hauptman Ham, LLP

(57) ABSTRACT

A circuit including a first switch receiving an input reference voltage, a second switch receiving an input testing voltage, the first switch and the second switch are electrically connected in parallel. The circuit further includes a first capacitor electrically connected in series with the first switch and the second switch. The circuit further includes a feedback stage comprising a feedback inverter electrically connected in parallel with a feedback switch, where the feedback stage is electrically connected in series with the first capacitor. The circuit further includes a first inverter electrically connected in series to the feedback stage, and a third switch electrically connected in series with the first inverter. The circuit further includes a second inverter electrically connected in parallel to a third inverter, the second inverter and the third inverter are electrically connected in series to the third switch, and the third inverter outputs a first output signal.

20 Claims, 5 Drawing Sheets

SWITCHED CAPACITOR COMPARATOR CIRCUIT

BACKGROUND

As technology nodes decrease, the density of features on a substrate increases. One way of increasing the density of features on the substrate is to form a three-dimensional integrated circuit (3DIC). However, 3DICs suffer from a problem of providing sufficient power integrity to each element of the 3DIC. Power integrity is a measure of stability of a power signal. The reduced area of the chip decreases the number of contact pads available to transmit power to components of the 3DIC. The fewer number of contact pads increases the resistance in the 3DIC. The increased resistance leads to greater concerns regarding power integrity. In some instances, a power spike or drop resulting from poor power integrity will cause the components of the 3DIC to function improperly.

Forming 3DICs also includes exerting force on the components of the 3DIC to form bonds between the components. In some instances, the forces exerted on the 3DIC components damages the components leading to improper functioning.

Some methods of testing 3DICs determine whether a 3DIC is functioning properly, but do not provide information regarding a reason for the failure, i.e., problems during manufacturing or poor power integrity. Some methods use an external scope to measure power integrity; however, these methods cannot measure power integrity during operation of the 3DIC. Some methods form a circuit to monitor power integrity during operation of the 3DIC, however, these circuits are complex and are designed specifically for each circuit, thus increasing production time and cost. These circuits also occupy significant area on the 3DIC, reducing the area available for other components.

DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
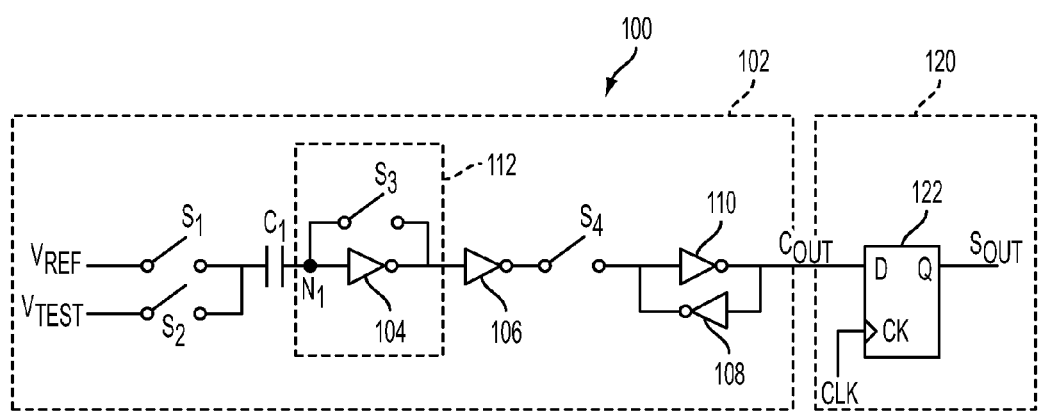
FIG. 1 is a schematic diagram of a power integrity testing circuit according to one or more embodiments.

FIG. 1 is a schematic diagram of a power integrity testing circuit 100. Power integrity testing circuit 100 includes a switched-capacitor comparator 102 coupled with a data synchronizer 120. Switched-capacitor comparator 102 provides a comparator output Cout based on a testing voltage Vtest dropping below a reference voltage Vref. Data synchronizer 120 receives comparator output Cout and combines comparator output Cout with a clock signal CLK and provides synchronized output S out. External circuitry compares synchronized output Sout with failures of components of a three-dimensional integrated circuit (3DIC). Comparing synchronized output Sout with failures helps determine whether the failures are a result of power integrity problems or manufacturing problems.

Switched-capacitor comparator 102 includes an input for reference voltage Vref and an input for testing voltage Vtest. Reference voltage Vref is a substantially constant voltage provided as a basis for comparison. Testing voltage Vtest is a supply voltage for the components of the 3DIC. A switch S1 is electrically connected to the input for reference voltage Vref. A switch S2 is electrically connected to the input for testing voltage Vtest. Switch S1 and switch S2 are electrically connected in parallel.

Switched-capacitor comparator 102 further includes a first capacitor C1 electrically connected in series to first switch S1 and second switch S2. A feedback stage 112 is electrically connected in series to first capacitor C1. Feedback stage 112 includes a third switch S3 and a first inverter 104 electrically connected in parallel. A second inverter 106 is electrically connected in series to feedback stage 112 and a fourth switch S4 is electrically connected in series to second inverter 106.

Switched-capacitor comparator 102 further includes a third inverter 108 and a fourth inverter 110 electrically connected in parallel. Third inverter 108 and fourth inverter 110 are electrically connected in series to fourth switch S4. An output of third inverter 108 is electrically connected to an input of fourth inverter 110. An output of the fourth inverter 110 is electrically connected to an input of third inverter 108. The output of fourth inverter is also comparator output Cout.

Data synchronizer 120 includes a flip-flop 122. Flip-flop 122 receives comparator output Cout at a terminal D and clock signal CLK at a terminal CK. Flip-flip 122 outputs synchronized output Sout from a terminal Q based on comparator output Cout and clock signal CLK.

During operation of power integrity testing circuit 100, switch S1 is controlled by a first sampling clock and switch S2 is controlled by a second sampling clock. The first sampling clock and the second sampling clock are complementary sampling clocks. During operation of switched-capacitor comparator 102, the first sampling clock and the second sampling clock alternate switches S1 and S2 between on and off states, so that one of first switch S1 or second switch S2 is on and the other is off. The frequency of the first sampling clock and the second sampling clock determine how short a time period switched-capacitor comparator 102 is able to detect. As the frequency of the first sampling clock and the second sampling clock increases, the accuracy of the power integrity testing circuit 100 increases. However, design considerations effectively limit the frequency. In some embodiments, the first sampling clock and the second sampling clock have a frequency of about 4 gigahertz (GHz). In some embodiments, the first sampling clock and the second sampling clock have a frequency of greater than 4 GHz.

In a charging phase of switched-capacitor comparator 102, switches S1 and S3 are closed by the first sampling clock, while switches S2 and S4 are opened by the second sampling clock. The charging phase establishes a voltage at a node N1 equal to a threshold voltage of the inverter. During the charging phase, the output of switched-capacitor comparator 102 is equal to the output of the previous sampling clock cycle.

Following the charging phase, switched-capacitor comparator 102 enters an evaluation phase. In the evaluation phase, switches S1 and S3 are opened by the first sampling clock, and switches S2 and S4 are closed by the second sampling clock. During the evaluation phase, the voltage at node N1 is equal to the difference between testing voltage Vtest and reference voltage Vref plus the threshold voltage of the inverter. The output of switched-capacitor comparator 102 depends on the relationship between testing voltage Vtest and reference voltage Vref. If testing voltage Vtest is greater than or equal to reference voltage Vref, switched-capacitor comparator 102 outputs a low logic state signal. If testing voltage Vtest is less than reference voltage Vref, switched-capacitor comparator 102 outputs a high logic state signal. The high logic state signal indicates a power drop.

Figure 2A:
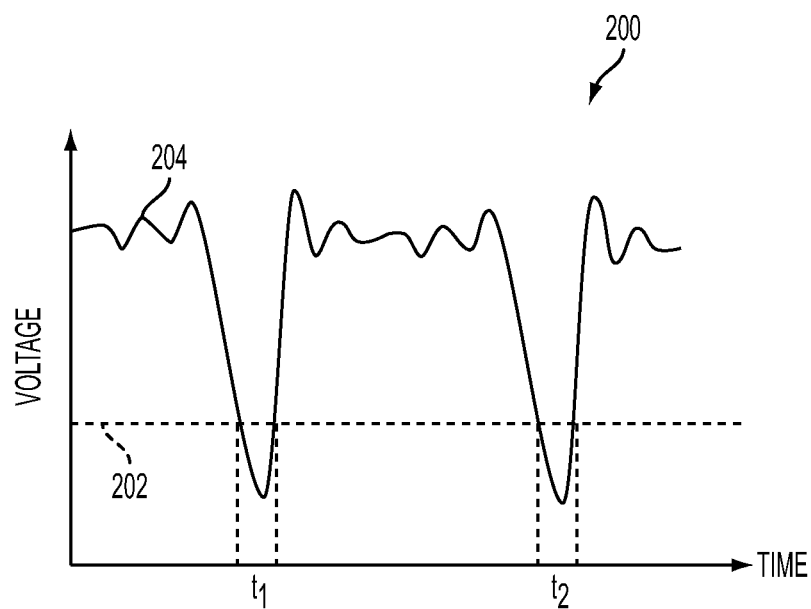
FIG. 2A is a graph of a reference voltage and a testing voltage versus time according to one or more embodiments.
Figure 2B:
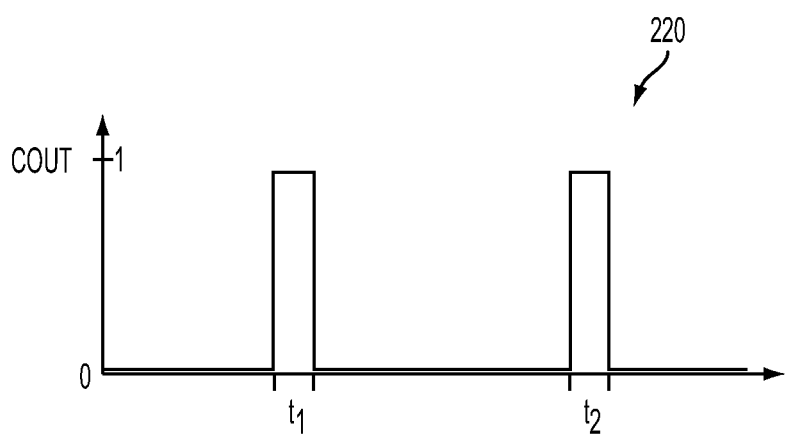
FIG. 2B is a graph of a comparator output versus time according to one or more embodiments.

FIG. 2A is a graph 200 of voltage versus time. Broken line 202 represents the voltage level of reference voltage Vref and solid line 204 represents the voltage level of testing voltage Vtest. Testing voltage Vtest drops below reference voltage during time periods t1 and t2. FIG. 2B is a graph 220 of comparator output Cout versus time. During time periods t1 and t2, comparator output Cout is in a high logic state. Thus, when testing voltage Vtest drops below reference voltage Vref, switched-capacitor comparator 102 produces a high logic output indicating a power drop.

Reference voltage Vref is determined based on the sensitivity of the components of the 3DIC to power drops. The higher the sensitivity, the closer Vref is to a calculated operating voltage. The calculated operating voltage is a supply voltage used to design the components of the 3DIC. Increasing a difference between reference voltage Vref and the calculated operating voltage, results in switched-capacitor comparator 102 signaling larger magnitude voltage drops while ignoring smaller magnitude voltage drops. In some embodiments, reference voltage Vref is selected to be 90% of the calculated operating voltage. In some embodiments, reference voltage Vref is selected to be 80% of the calculated operating voltage.

To precisely determine the voltage drop experienced by the components of the 3DIC, switched-capacitor comparator 102 is calibrated to determine a variation between a selected reference voltage and an actual reference voltage. The selected reference voltage is determined based on the sensitivity of the components of the 3DIC. In some instances, the actual reference voltage differs from the selected reference voltage.

Figure 3:
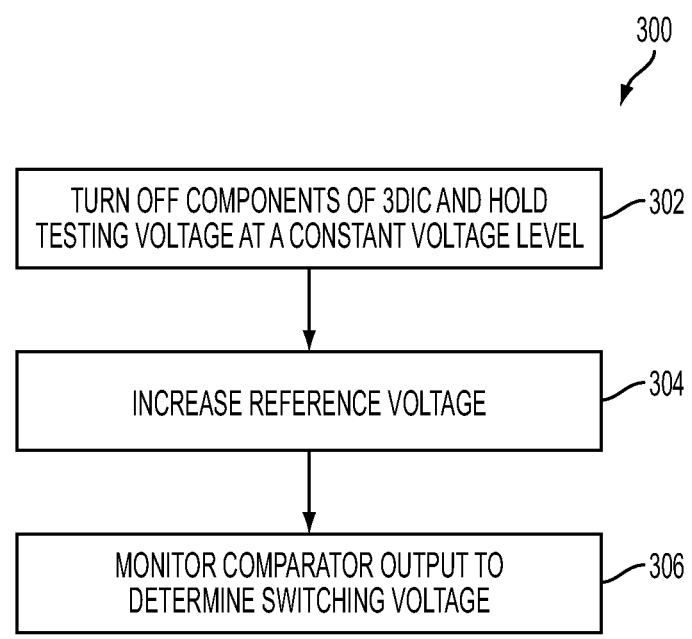
FIG. 3 is a flow chart for a method of calibrating a switched-capacitor comparator according to one or more embodiments.

FIG. 3 is a flow chart for a method 300 of calibrating switched-capacitor comparator 102. In step 302, the components of the 3DIC are turned off and testing voltage Vtest is held at a constant voltage level equal to the selected reference voltage. In step 304, reference voltage Vref is slowly increased starting at a zero voltage level. In step 306, comparator output Cout is monitored to determine a switching voltage where the reference voltage Vref exceeds testing voltage Vtest.

An output offset voltage is the difference between an actual output voltage and an ideal output voltage when two input terminals are electrically connected. The output offset voltage divided by a gain of the comparator is an input offset voltage. The input offset is included in the comparison of reference voltage Vref and the testing voltage Vtest during normal operation of switched-capacitor comparator 102. In this manner, a precise measurement of the power integrity is obtained.

Figure 4:
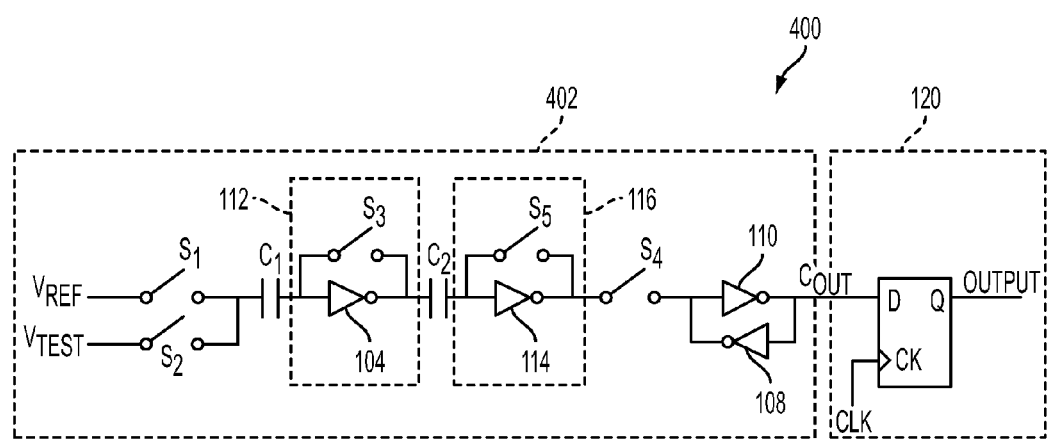
FIG. 4 is a schematic diagram of a power integrity testing circuit having auto-zero capabilities according to one or more embodiments.

FIG. 4 is a schematic diagram of a power integrity testing circuit 400 having auto zero capabilities, i.e., automatic calibration. Power integrity circuit 400 includes a switched-capacitor comparator 402 for comparing reference voltage Vref to testing voltage Vtest. Power integrity circuit 400 further includes data synchronizer 120. Data synchronizer 120 of power integrity testing circuit 400 is the same as data synchronizer 120 of power integrity testing circuit 100 (FIG. 1).

Switched-capacitor comparator 402 is similar to switched-capacitor comparator 102. Switched-capacitor comparator 402 includes the input for reference voltage Vref and the input for testing voltage Vtest. Switch S1 is electrically connected to the input for reference voltage Vref. Switch S2 is electrically connected to the input for testing voltage Vtest. Switch S1 and switch S2 are electrically connected in parallel.

Switched-capacitor comparator 402 further includes first capacitor C1 electrically connected in series to first switch S1 and second switch S2. Feedback stage 112 is electrically connected in series to first capacitor C1. Feedback stage 112 includes a third switch S3 and a first inverter 104 electrically connected in parallel.

Unlike switched-capacitor comparator 102, switched-capacitor comparator 402 does not include second inverter 106. In place of second inverter 106, switched-capacitor comparator 402 includes a second capacitor C2 and a second feedback stage 116. Second feedback stage 116 includes a fifth inverter 114 and a fifth switch S5 electrically connected in parallel. Second capacitor C2 is electrically connected in series between feedback stage 112 and second feedback stage 116.

Switched-capacitor comparator 402 further includes fourth switch S4 electrically connected in series to second feedback stage 116. Third inverter 108 and fourth inverter 110 are electrically connected in parallel. Third inverter 108 and fourth inverter 110 are electrically connected in series to fourth switch S4. An output of third inverter 108 is electrically connected to an input of fourth inverter 110. An output of the fourth inverter 110 is electrically connected to an input of third inverter 108. The output of fourth inverter is also comparator output Cout.

Second feedback stage 116 enables switched-capacitor comparator 402 to use auto-zeroing techniques. Because switched-capacitor comparator 402 includes auto-zeroing capabilities, the offset in switched-capacitor comparator 402 is reduced.

Figure 5:
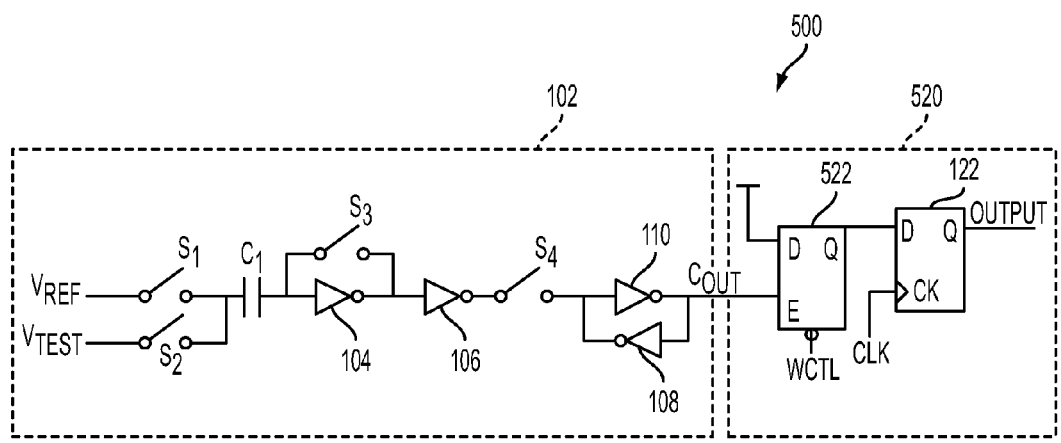
FIG. 5 is a schematic diagram of a power integrity testing circuit having cycle to cycle monitoring capabilities according to one or more embodiments.

FIG. 5 is a schematic diagram of a power integrity testing circuit 500 having cycle to cycle monitoring capabilities, i.e., measuring whether a voltage drop occurs within a clock cycle. Power integrity circuit 500 includes a switched-capacitor comparator 102 for comparing reference voltage Vref to testing voltage Vtest. Power integrity circuit 500 further includes a data synchronizer 520. Switched-capacitor comparator 102 of power integrity testing circuit 500 is the same as switched-capacitor comparator 102 of power integrity testing circuit 100.

Data synchronizer 520 includes a latch 522 and flip-flop 122. Flip-flop 122 of data synchronizer 520 is the same as flip-flip 122 of data synchronizer 120. Latch 522 is electrically connected in series between flip-flop 122 and comparator output Cout. Latch 522 receives a high logic signal, e.g., voltage drain drain (VDD), at a terminal D and comparator output Cout at terminal E. In some embodiments, VDD is an operating voltage. Latch 522 also receives a window control signal WCTL. Latch 522 outputs a signal at terminal Q, responsive to a voltage drop, which is received by flip-flop 122 at terminal D.

Latch 522 outputs a high logic signal if a power drop is detected during a monitoring cycle. The monitoring cycle is one cycle of clock signal CLK. If a power drop is detecting during a monitoring cycle, synchronized output Sout remains at a high logic state for the remaining time period of the monitoring cycle. Window control signal WCTL resets latch 522 to a low logic state following each monitoring cycle. In some embodiments, data synchronizer 520 is used in place of data synchronizer 120 to synchronize output Sout and signals from external digital circuitry. In some embodiments, a monitoring cycle ranges from 1.5 nanoseconds to 2.0 nanoseconds.

Power integrity testing circuits 100, 400 and 500 are digital circuits and avoid the added design effort necessary to create complex analog circuits. Because power integrity testing circuits 100, 400 and 500 are not specifically tailored to individual 3DICs, power integrity testing circuits 100, 400 and 500 are able to be incorporated into a layout design prior to finalizing the features of the layout. The ability to incorporate the power integrity testing circuits 100, 400 and 500 into an unfinished layout enables designers to maximize utilization of an area of the 3DIC. The lack of customization also decreases production cost because masks used to form power integrity testing circuits 100, 400 and 500 are able to be used repeatedly for different types of 3DICs.

One aspect of this description relates to a circuit including a first switch configured to receive an input reference voltage, a second switch configured to receive an input testing voltage, where the first switch and the second switch are electrically connected in parallel, a first capacitor electrically connected in series with the first switch and the second switch, a feedback stage comprising a feedback inverter electrically connected in parallel with a feedback switch, where the feedback stage is electrically connected in series with the first capacitor, a first inverter electrically connected in series to the feedback stage, a third switch electrically connected in series with the first inverter, a second inverter electrically connected in parallel to a third inverter, wherein the second inverter and the third inverter are electrically connected in series to the third switch, and the third inverter is configured to output a first output signal.

Another aspect of this description relates to a method of testing a failure in a circuit including forming a circuit, where the circuit includes a first switch configured to receive an input reference voltage, a second switch configured to receive an input testing voltage, where the first switch and the second switch are electrically connected in parallel, a first capacitor electrically connected in series with the first switch and the second switch, a feedback stage comprising a feedback inverter electrically connected in parallel with a feedback switch, wherein the feedback stage is electrically connected in series with the first capacitor, a first inverter electrically connected in series to the feedback stage, a third switch electrically connected in series with the first inverter, a second inverter electrically connected in parallel to a third inverter, wherein the second inverter and the third inverter are electrically connected in series to the third switch, and the third inverter is configured to output a first output signal, and detecting the first output signal to determine a difference between the reference voltage and the testing voltage.

Still another aspect of this description a circuit including a first switch configured to receive an input reference voltage, a second switch configured to receive an input testing voltage, where the first switch and the second switch are electrically connected in parallel, a first capacitor electrically connected in series with the first switch and the second switch, a first feedback stage including a first feedback inverter electrically connected in parallel with a first feedback switch, where the first feedback stage is electrically connected in series with the first capacitor, a second capacitor electrically connected in series to the first feedback stage, a second feedback stage comprising a second feedback inverter electrically connected in parallel with a second feedback switch, wherein the second feedback stage is electrically connected in series with the second capacitor, a third switch electrically connected in series with the first inverter, a second inverter electrically connected in parallel to a third inverter, wherein the second inverter and the third inverter are electrically connected in series to the third switch, and the third inverter is configured to output a first output signal.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. A switched-capacitor comparator circuit comprising:
a first switch configured to receive an input reference voltage;
a second switch configured to receive an input testing voltage, wherein the first switch and the second switch are electrically connected in parallel;
a capacitor electrically connected in series with the first switch and the second switch;
a feedback stage comprising a feedback inverter electrically connected in parallel with a feedback switch, wherein the feedback stage is electrically connected in series with the capacitor;
a first inverter electrically connected in series to the feedback stage and configured to receive an output voltage of the feedback stage;
a third switch electrically connected in series with the first inverter; and
a second inverter electrically connected in parallel to a third inverter, wherein the second inverter and the third inverter are electrically connected in series to the third switch, the second inverter is configured to output a first output signal to an input of the third inverter during a whole cycle of operation of the switched-capacitor comparator circuit, and the third inverter is configured to output a second output signal that is received by an input of the second inverter during a whole cycle of operation of the switched-capacitor comparator circuit.
2. The circuit of claim 1, wherein the first switch is configured to be controlled by a first sampling clock and the second switch is configured to be controlled by a second sampling clock.

3. The circuit of claim 2, wherein the feedback switch is configured to be controlled by the first sampling clock and the third switch is configured to be controlled by the second sampling clock.

4. The circuit of claim 2, wherein the first sampling clock and the second sampling clock are complementary sampling clocks.

5. The circuit of claim 2, wherein the first sampling clock and the second sampling clock both have a frequency greater than about 4 GHz.

6. The circuit of claim 1, further comprising a data synchronizer, wherein the data synchronizer comprises:
a flip-flop configured to receive the second output signal and a clock signal, and wherein the flip-flop is configured to output a third output signal.

7. The circuit of claim 1, further comprising a data synchronizer, wherein the data synchronizer comprises:
a latch configured to receive the second output signal, an operating voltage and a window control signal, wherein the latch is configured to output a third output signal; and
a flip-flop configured to receive the third output signal and a clock signal, wherein the flip-flop is configured to output a fourth output signal.

8. A method of testing a failure in a circuit comprising:
forming a switched-capacitor comparator circuit, wherein the switched-capacitor comparator circuit comprises:
a first switch configured to receive an input reference voltage;
a second switch configured to receive an input testing voltage, wherein the first switch and the second switch are electrically connected in parallel;
a capacitor electrically connected in series with the first switch and the second switch;
a feedback stage comprising a feedback inverter electrically connected in parallel with a feedback switch, wherein the feedback stage is electrically connected in series with the capacitor;
a first inverter electrically connected in series to the feedback stage and configured to receive an output voltage of the feedback stage;
a third switch electrically connected in series with the first inverter;
a second inverter electrically connected in parallel to a third inverter, wherein the second inverter and the third inverter are electrically connected in series to the third switch, the second inverter is configured to output a first output signal to an input of the third inverter during a whole cycle of operation of the switched-capacitor comparator circuit, and the third inverter is configured to output a second output signal that is received by an input of the second inverter during a whole cycle of operation of the switched-capacitor comparator circuit; and
detecting the second output signal to determine a difference between the input reference voltage and the input testing voltage.

9. The method of claim 8, further comprising:
controlling the first switch and the feedback switch using a first sampling clock; and
controlling the second switch and the third switch using a second sampling clock, wherein the first sampling clock and the second sampling clock are complementary sampling clocks.

10. The method of claim 8, further comprising:
comparing the detected second output signal to a failure of a component in the circuit; and
determining whether the failure of the component resulted from a power drop.

11. The method of claim 8, wherein detecting the second output signal comprises using a data synchronizer, wherein the data synchronizer comprises:
a flip-flop configured to receive the second output signal and a clock signal, and the flip-flop is configured to output a third output signal, and
outputting a high logic state in the third output signal if the testing voltage is less than the reference voltage.

12. The method of claim 8, wherein detecting the second output signal comprises using a data synchronizer, wherein the data synchronizer comprises:
a latch configured to receive the second output signal, an operating voltage and a window control signal, wherein the latch is configured to output a third output signal; and
a flip-flop configured to receive the third output signal and a clock signal, wherein the flip-flop is configured to output a fourth output signal, and
outputting a high logic state in the fourth output signal if the testing voltage is less than the reference voltage at any time during a monitoring cycle.

13. The method of claim 12, wherein the monitoring cycle is in a range of about 1.5 nanoseconds to about 2.0 nanoseconds.

14. A circuit comprising:
a first switch configured to receive an input reference voltage;
a second switch configured to receive an input testing voltage, wherein the first switch and the second switch are electrically connected in parallel;
a first capacitor electrically connected in series with the first switch and the second switch;
a first feedback stage comprising a first feedback inverter electrically connected in parallel with a first feedback switch, wherein the first feedback stage is electrically connected in series with the first capacitor;
a second capacitor electrically connected in series to the first feedback stage;
a second feedback stage comprising a second feedback inverter electrically connected in parallel with a second feedback switch, wherein the second feedback stage is electrically connected in series with the second capacitor;
a third switch electrically connected in series with the second feedback inverter;
a first inverter electrically connected in parallel to a second inverter, wherein the first inverter and the second inverter are electrically connected in series to the third switch, the second inverter is configured to output a first output signal, and an output of the first inverter is connected to an input of the second inverter during a whole cycle of operation of the circuit.

15. The circuit of claim 14, wherein the first switch is configured to be controlled by a first sampling clock, and the second switch is configured to be controlled by a second sampling clock.

16. The circuit of claim 15, wherein the first feedback switch and the second feedback switch are configured to be controlled by the first sampling clock, and the third switch is configured to be controlled by the second sampling clock.

17. The circuit of claim 15, wherein the first sampling clock and the second sampling clock are complementary sampling clocks.

18. The circuit of claim 15, wherein the first sampling clock and the second sampling clock both have a frequency greater than about 4 GHz.

19. The circuit of claim 14, further comprising a data synchronizer, wherein the data synchronizer comprises:
   a flip-flop configured to receive the first output signal and a clock signal, and the flip-flop is configured to output a second output signal.

20. The circuit of claim 14, further comprising a data synchronizer, wherein the data synchronizer comprises:
   a latch configured to receive the first output signal, an operating voltage and a window control signal, wherein the latch is configured to output a second output signal; and
   a flip-flop configured to receive the second output signal and a clock signal, wherein the flip-flop is configured to output a third output signal.

* * * * *